United States

Harms et al.

[11] 4,070,622
[45] Jan. 24, 1978

[54] MAGNETO-OPTICAL HIGH VOLTAGE CURRENT MEASURING TRANSDUCER

[75] Inventors: Hauke Harms; Ernst Feldtkeller, both of Munich, Germany

[73] Assignee: Siemens Aktiengesellschaft, Berlin & Munich, Germany

[21] Appl. No.: 721,949

[22] Filed: Sept. 10, 1976

[30] Foreign Application Priority Data

Sept. 26, 1975   Germany .............................. 2543134

[51] Int. Cl.² ............................................ G01R 31/00
[52] U.S. Cl. ....................................... 324/96; 350/151; 350/157
[58] Field of Search ................... 324/96; 350/151, 157; 250/199

[56] References Cited

U.S. PATENT DOCUMENTS 3,769,584   10/1973   Iten et al. ................................. 324/96

*Primary Examiner*—Stanley T. Krawczewicz
*Attorney, Agent, or Firm*—Hill, Gross, Simpson, Van Santen, Steadman, Chiara & Simpson

[57] ABSTRACT

A magneto-optical measuring transducer for measuring high voltage currents with a measurement sensing device which carries high voltage potential and is designed as a light conducting coil, with which linearly polarized light is rotated with respect to its polarization direction, in dependence upon the strength of a magnetic field produced by the current to be measured, the light conducting coil being in the form of elements, which lie in respective planes of curvature disposed at right angles to one another, with such elements following one another in the propagation direction of the linearly polarized light.

11 Claims, 3 Drawing Figures

MAGNETO-OPTICAL HIGH VOLTAGE CURRENT MEASURING TRANSDUCER

BACKGROUND OF THE INVENTION

1. Field of the Invention

The invention relates to a magneto-optical high voltage current measuring transducer utilizing a measurement sensing device carrying high potential and designed as a light conducting coil, with which linearly polarized light is rotated with respect to the direction of its polarization, in dependence upon the strength of the magnetic field which is produced by the current to be measured, whereby the rotation may be utilized as a criteria for the high voltage current to be measured.

Magneto-optical measuring transducers are known, for example, such as illustrated in German AS 1,283,363, in which polarized light is transmitted through a first Faraday rotator, which functions as a measurement sensing component, and is disposed in a magnetic field which is dependent upon the high voltage current to be measured. Upon passage through such Faraday rotator, the direction of polarization of the polarized light beam is rotated in dependence upon the effective magnetic field. The polarized light, following its passage through the Faraday rotator and changed in its polarization direction is then conducted through a second Faraday rotator, functioning as a compensator, which carries ground potential. The compensator is disposed in an adjustable magnetic field, whereby the polarized light, in its changed polarization direction, is rotated back to its original polarization direction. The strength of the adjustable magnetic field accomplishing this function thus may be utilized as a criterion for the strength of the current to be measured.

It is already known from German OS 2,130,047 to utilize a Faraday rotator as a light conductor coil. Such a light conductor coil consists of a glass fiber through which the polarized light beam is conducted which, as it passes through the glass fiber, is rotated with respect to its polarization direction in dependence upon the influencing magnetic field.

Faraday rotators of this type, designed as light conductor coils, are subject to limitations, in particular with respect to the measuring accuracy, as a result of mechanical stresses or tensions created during production and because of the curvature of the light conducting fibers, birefringence errors occur.

SUMMARY OF THE INVENTION

The invention therefore has as its particular objective, the avoidance of such birefringent errors. This objective is achieved in a high voltage current measurement transducer by the employment of light conducting coil segments which have planes of curvature which are at right angles to one another, with such elements following one another in the propagation direction of the linearly polarized light.

The invention is based on the novel recognition that, with respect to their influence on polarized light, coils composed of light-conducting fibers can be described or considered, by way of example, as a birefringent crystal. For reasons of symmetry, a main axial direction conforms with the coil axis. In a birefringent crystal, main axial directions are understood as those directions of polarization with which a linearly polarized light beam can pass through the crystal without alteration in the polarization of the beam.

Every birefringent crystal possesses two main axial directions which are at right angles to one another. If it is traversed by a linearly polarized light beam having a polarization direction which differs from the main axial direction, ellyptically polarized light is formed. If two similar crystals are optically connected in series in such a manner that the direction of the main axis with the more rapid light propagation in the one crystal conforms with the direction of the main axis with the slower light propagation in the other crystal, i.e., when the smaller main axial directions cross one another, the difference in transit time for different polarization directions is compensated so that a linearly polarized light beam which enters this crystal combination emerges linearly polarized again, and in fact independently of its polarization direction. Consequently, in accordance with this recognition, it is possible to optically connect two identical light-conducting coils in series with the coil axes to be aligned at right angles to one another. The one light-conducting coil can function as a measurement sensing device and carries high voltage potential, while the other light-conducting coil can function as a compensator and carries ground potential. With such an arrangement, the curvature-dependent birefringence can be materially reduced.

An even greater compensation of the birefringence can be achieved by the utilization of light-conducting coils constructed from light-conducting fibers which are, as much as possible, free of production-dependent mechanical tensions, thereby largely eliminating the effects known as stress birefringence.

Accordingly, in an advantageous embodiment of a measurement transducer in accordance with the invention, light-conducting fibers are employed having a liquid core.

In comparison to glass fibers, light-conducting fibers with a liquid core have the advantage that no production-dependent mechanical stresses occur in the finished product. Heretofore, irregular mechanical tensions have occurred within glass fibers during their manufacture, the magnitude of which tensions could not be predetermined. Thus, fibers of this type exhibit a production-dependent birefringence which is also temperature-dependent. On the other hand, light conducting fibers having a liquid core exhibit a birefringence which, apart from negligible influences of mechanical surface tensions and asymmetry of the light conducting casing is clearly related or coupled with the curvature of the light-conducting fiber.

While it has heretofore been possible to produce light-conducting fibers largely free of mechanical tensions only with liquid cores, glass fibers are equally suitable, provided it is possible to manufacture them free of such tensions.

In the invention, the turns of the light-conducting coils are divided into similar segments, the planes of curvature of successive segments being at right angles to one another. The arrangement is based upon the recognition that a full compensation of the coupled refraction, caused by the series-connected birefringent elements in which the like main axes are at right angles to one another, is possible ony when the birefringent elements are not simultaneously Faraday rotators in a magnetic field. In the publication "Applied Optics 11" (1972) pages 617–621, Jaecklin and Lietz have pointed out that the compensation of the birefringence by two flint glass blocks designed as Faraday rotators is incomplete.

In accordance with the invention, the successive segments with planes of curvature at right angles to one another insure that only a slight Faraday rotation and only a slight birefringence, which is dependent upon the curvature of the fiber, is produced in each segment. Surprisingly, it is proved that the large number of small birefringence errors produced by a number of segments can be more effectively compensated than the relatively large birefringent errors of two series-connected like conducting coils with coil axes at right angles to one another, as above described.

BRIEF DESCRIPTION OF THE DRAWINGS

In the drawings wherein like reference characters indicate like or corresponding parts.

DETAILED DESCRIPTION OF PREFERRED EMBODIMENTS OF THE INVENTION

Figure 1:
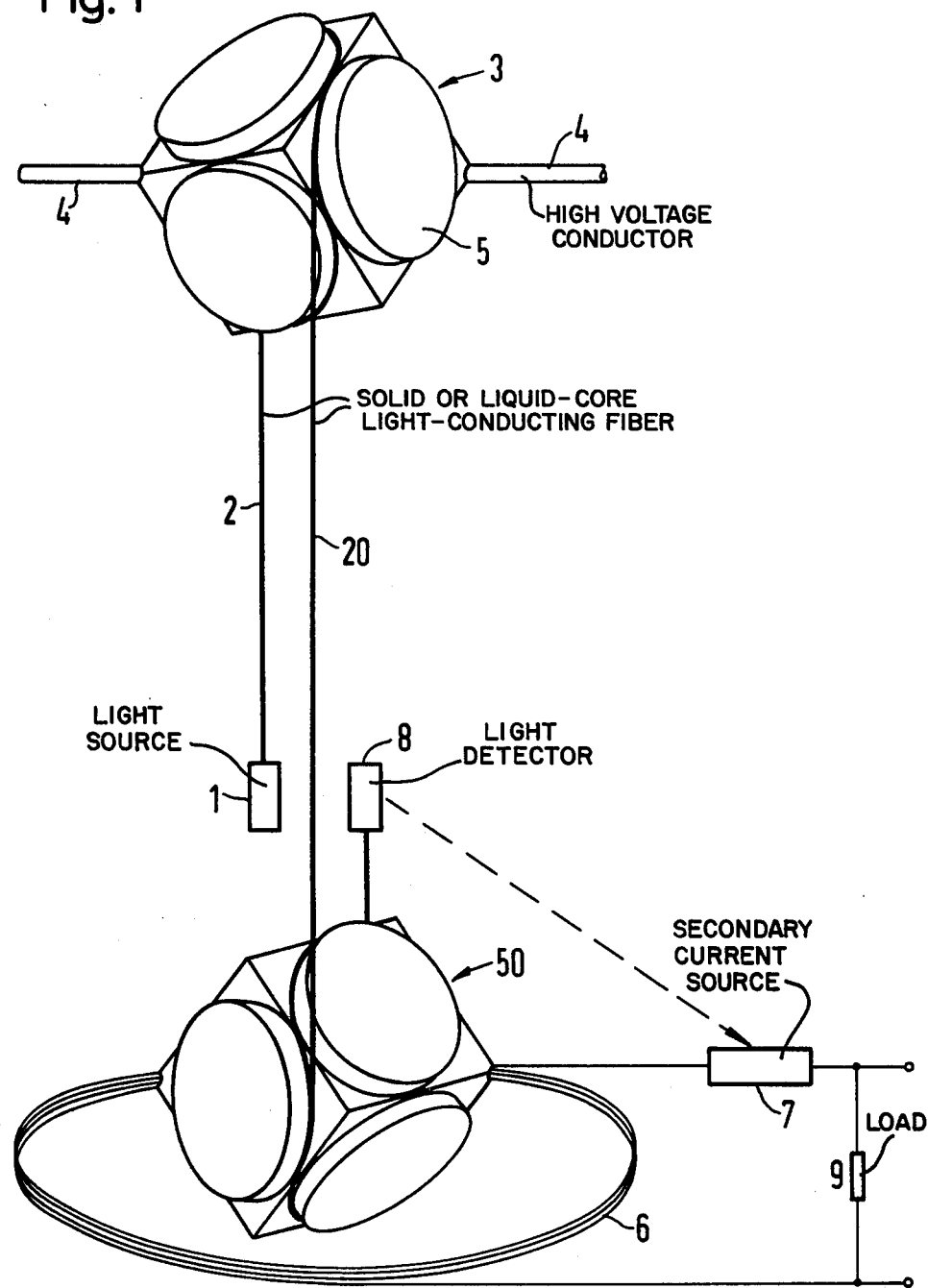
FIG. 1 is a semi-diagrammatic figure of a measurement sensing device, cooperable compensating device and associated structure.

Referring to FIG. 1, the reference numeral 1 designates a light source which carries ground potential, which can, for example, comprise a laser, and produces a linearly polarized light beam which is conducted through a light-conducting fiber 2 to a measurement sensing device 3 in the form of a light-conducting coil which surrounds a high voltage conductor 4 traversed, at least in part, by the current to be measured. The light-conducting coil is wrapped around a body 5 which basically comprises three circular cylinders disposed at right angles to one another with their relative orientation being illustrated by the representation of a cube whose faces are penetrated by the cylinders. The light-conducting fiber of the measurement sensing device changes its curvature plane with each quarter turn, beginning and ending with an eighth turn, with each following curvature plane being at right angles to the plane of curvature of the preceding eighth or quarter turn. Thus, in this example the coil segments are eighth and quarter turns.

It will be apparent that only those parts carrying the light-conducting coil are required and the other parts can be omitted.

Figure 2:
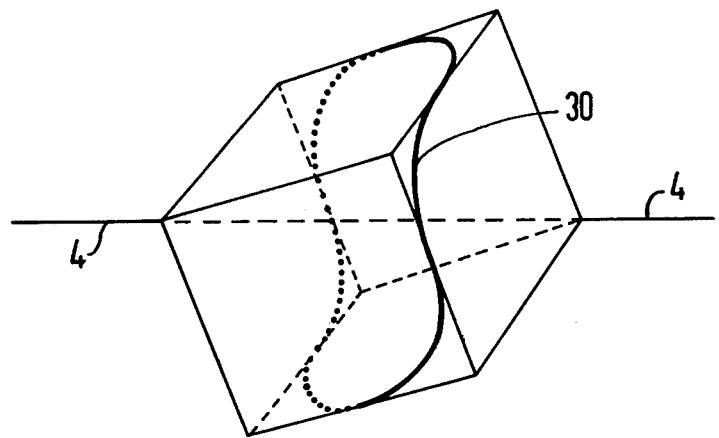
FIG. 2 is a schematic representation of the path of the light conducting fiber.

The course of the light-conducting fiber in the measurement sensing device may be better understood from a reference to FIG. 2, which merely illustrates the cube depicted in FIG. 1, and which illustrates merely the path of the light-conducting fiber and its relation to the high voltage conductor 4.

As will be apparent from a reference to FIG. 1, a light-conducting fiber 20 extends from the measurement sensing device to a compensator 50 which carries ground potential. Such compensator is disposed in a compensating magnetic field produced by means of a secondary current source 7 which is connected to a coil 6. The current strength of the secondary current source is suitably adjusted in such a manner that the light beam received at the detector 8 possesses the same polarization direction as at the light source 1. It is thereby possible to derive a varying voltage at a load resistor 9 which functions as a criterion for the magnitude of the high voltage current to be measured in the high voltage conductor 4.

As illustrated, the compensator preferably can utilize a light-conducting coil similar to that of the measurement sensing device.

Figure 3:
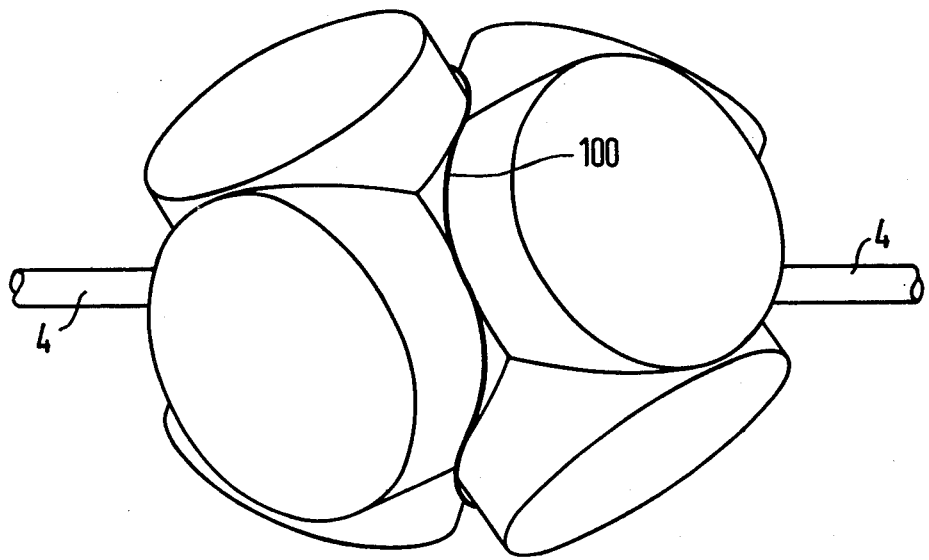
FIG. 3 schematically illustrates a further embodiment of the construction of a light-conducting coil for use as the measurement sensing and compensating devices.

FIG. 3 illustrates another embodiment of light-conducting coil utilizable in the measurement sensing and compensating devices, in which the light-conducting fiber 100 changes its plane of curvature in less than one quarter turn. In this example the segments are about 65° turns, with successive segments having planes of curvature which are at right angles to one another.

In the body illustrated in FIG. 3, only those components carrying the light-conducting coil are required.

Figure 4:
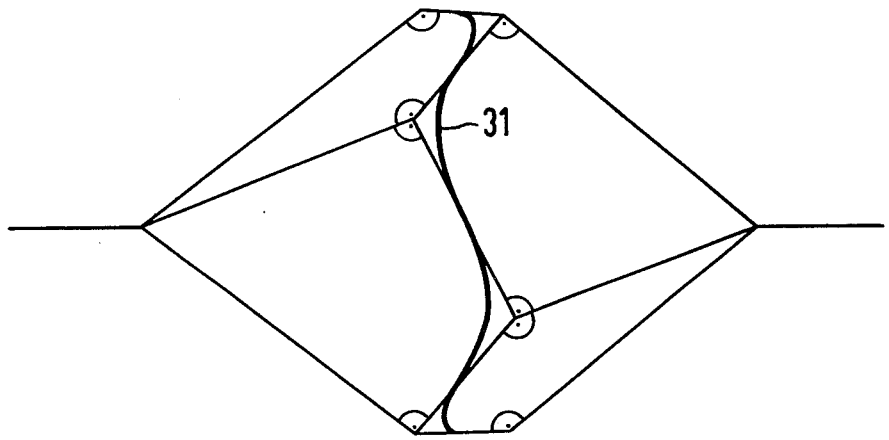
FIG. 4 schematically illustrates the configuration of the light-conducting fiber of the light-conducting coil illustrated in FIG. 3.

FIG. 4 illustrates the course 31 of a light-conducting fiber of the light-conducting coil illustrated in FIG. 3, in which the path 31 is disposed on what may be considered as a double pyramidal structure whose side surfaces are formed by kite-shaped faces with right side angles.

Figure 5:
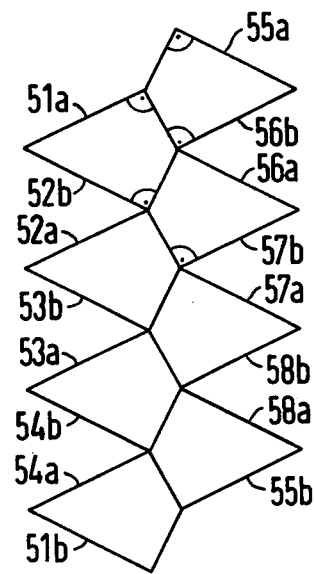
FIG. 5 is a development of the arrangement illustrated in FIG. 4.

FIG. 5 represents a development of the double pyramidal configuration illustrated in FIG. 4, in which, in the three dimensional structure, the respective pairs of edges 51a-51b, . . ., 58a-58b abut one another.

It will also be apparent that it is likewise possible to form double pyramids, whose lateral faces are of kite-shaped configuration with right side angles, but utilizing a larger number of side faces. The right side angles causes that successive coil segments possess planes of curvature which are at right angles to one another. The compensation is improved by utilization of a plurality of segments and all the light-conducting coils should possess several windings as the extent of the overall Faraday rotation produced is correspondingly multiplied.

The respective bodies carrying the light-conducting coils preferably comprise an insulating material, for example, a synthetic material, which only slightly influences magnetic fields.

The detector 8 can, for example, be constructed in known manner, whereby the incoming light beam is split by means of a Wollaston prism into two subordinate beams polarized at right angles to one another, whose polarization directions form an angle of 45° with the polarization direction of the light beam produced by the light source 1. The two secondary beams, polarized at right angles to one another are each conducted towards a light measuring device by means of which the intensities of the two beams are measured. The ratio of the two intensities is then a criterion for the polarization direction of the light beam entering the detector 8. If the ratio of the intensities is equal to 1, the incoming light possesses the same polarization direction as the light source 1.

Light-conducting fibers with a liquid core are, per se, known, for example, in the publication W. A. Gamblin, D. N. Payne, H. Matsumura, Electron. Lett. 10 (1974) pages 148–149.

Light-conducting fibers of this type possess, for example, a liquid core consisting of hexachlorobuta-1.3-dien. The liquid core has an index of refraction of $n_1 = 1.551$, and the glass casing has, for example, an index of refraction $n_2 = 1.482$. However, it was heretofore unknown to arrange such fibers in a measuring transducer.

Having thus described our invention it will be obvious that although various minor modifications might be suggested by those versed in the art, it should be understood that we wish to embody within the scope of the patent granted hereon all such modifications as reasonably, and properly come within the scope of our contribution to the art.

We claim as our invention:

1. A magneto-optical transducer for measuring high-voltage currents carried by a high-voltage conductor, comprising a measuring sensing device having a light-conducting coil means formed by a light-transmitting conductor, said coil means being divided into a plurality of similar coil elements, each of which is less in circumferential length than a single complete coil turn of said light-transmitting conductor, each of said elements being disposed in a plane of curvature extending at right angles to the plane of an adjacent element, with such elements following one another in the propagation direction of the linearly polarized light, said coil means being so disposed, with respect to such a high-voltage conductor, that it will be positioned in the magnetic field created by current flowing therein, whereby linearly polarized light, supplied to the light-transmitting conductor, will have the polarization plane thereof rotated in dependence upon the strength of said magnetic field.

2. A measuring transducer according to claim 1, wherein the light-conducting coil elements are equal length segments of the light-conducting coil means.

3. A measuring transducer according to claim 2, wherein the segments are quarter turns.

4. A measuring transducer according to claim 2, wherein the segments are 65° turns.

5. A measuring transducer according to claim 3, wherein the measuring transducer is provided with a second light-conducting coil, arranged as a compensator, and having a construction similar to that of said light-conducting coil of the measurement sensing device, the latter coil being optically connected to said second coil.

6. A measuring transducer according to claim 4, wherein the measuring transducer is provided with a second light-conducting coil, arranged as a compensator, and having a construction similar to that of said light-conducting coil of the measurement sensing device, the latter coil being optically connected to said second coil.

7. A measuring transducer according to claim 3, comprising rotation-determining means including means for producing an adjustable magnetic field, in which said second light-conducting coil is disposed, cooperable therewith to rotate the light to its original polarization direction, with the strength of such magnetic field thereby forming a criterion for the high voltage current to be measured.

8. A measuring transducer according to claim 4, comprising rotation-determining means including means for producing an adjustable magnetic field, in which said second light-conducting coil is disposed, cooperable therewith to rotate the light to its original polarization direction, with the strength of such magnetic field thereby forming a criterion for the high voltage current to be measured.

9. A measuring transducer according to claim 1 wherein the light conductor possesses a liquid core.

10. A measuring transducer according to claim 1, wherein the measuring transducer is provided with a second light-conducting coil, arranged as a compensator, and having a construction similar to that of said light conducting coil of the measurement sensing device, the latter coil being optically connected to said second coil.

11. A measuring transducer according to claim 10, wherein the light conductors possess a liquid core.

* * * * *